United States Patent [19]
Fujioka

[11] Patent Number: 5,804,893
[45] Date of Patent: Sep. 8, 1998

[54] SEMICONDUCTOR DEVICE WITH APPROPRIATE POWER CONSUMPTION

[75] Inventor: Shinya Fujioka, Kawasaki, Japan

[73] Assignee: Fujitsu Limited, Kawasaki, Japan

[21] Appl. No.: 818,714

[22] Filed: Mar. 14, 1997

[30] Foreign Application Priority Data

Oct. 17, 1996 [JP] Japan ..................... 8-274745

[51] Int. Cl.$^6$ .................................. H03K 3/027
[52] U.S. Cl. .................. 307/125; 307/116; 327/108; 327/143; 327/530; 365/227
[58] Field of Search .................. 307/125, 116; 327/530, 89, 143, 108; 365/227

[56] References Cited

U.S. PATENT DOCUMENTS

| | | | |
|---|---|---|---|
| 4,683,382 | 7/1987 | Sakurai et al. | 327/89 |
| 4,985,641 | 1/1991 | Nagayama et al. | 327/143 |
| 5,376,839 | 12/1994 | Horiguchi et al. | 327/530 |
| 5,625,596 | 4/1997 | Uchida | 365/227 |

OTHER PUBLICATIONS

*Electronic Circuit,* ed. Hsiao Ming–Chun, 1988 (1st ed.), publ. Tung Chiang Book Company.

*Electricity,* ed. Hsiao Hung–Ching, 1990 (1st ed.), publ. Chung Yang Book Company.

Primary Examiner—Richard T. Elms
Assistant Examiner—Albert W. Paladini
Attorney, Agent, or Firm—Nikaido, Marmelstein, Murray & Oram LLP

[57] ABSTRACT

A semiconductor device operable in a selected mode which is selected from a plurality of operation modes, a number of the operation modes being more than two. The semiconductor device includes a plurality of voltage supply circuits for supplying an internal voltage to internal circuits of the semiconductor device, and a control circuit for driving a predetermined number of the voltage supply circuits based on a signal indicating the selected mode, the control circuit changing the predetermined number for each of the operation modes.

10 Claims, 6 Drawing Sheets

SEMICONDUCTOR DEVICE WITH APPROPRIATE POWER CONSUMPTION

BACKGROUND OF THE INVENTION

1. Field of the Invention

The present invention generally relates to semiconductor integrated circuits, and particularly relates to a voltage-reduction circuit used in semiconductor integrated circuits.

2. Description of the Related Art

Semiconductor integrated circuits with high integration density need to operate internal circuits at a reduced power voltage level in order to ensure reliability of transistors and to reduce power consumption. It is difficult, however, to allow a free setting to be made to a power voltage level supplied to semiconductor integrated circuits because of limitations on an external interface or the like. In general, internal voltage-reduction circuits are provided inside the semiconductor integrated circuits to transform the externally supplied power voltage to a desired power voltage level.

Semiconductor integrated circuits usually operate in two different modes, i.e., a standby mode and an active mode. The standby mode is used when internal circuits in the semiconductor integrated circuits are inactive, and the active mode is used when these internal circuits are activated. In a semiconductor memory device such as a DRAM, the standby mode represents a state of the device waiting for command input, and the active mode represents a state of the device in which data-read/write operations are conducted to memory cells of the device.

The standby mode and the active mode of the semiconductor integrated circuits require different characteristics of the internal voltage-reduction circuits in terms of the amount of current supplied to the internal circuits and a response speed in coping with AC variations in voltages caused by operations of the internal circuits. During the standby mode, the amount of supplied current is sufficient if it can compensate for leak currents in transistors, and the response speed to the voltage AC variations can be relatively slow since the internal circuits are inactive. On the other hand, during the active mode, an amount of current in the range of mA is necessary since a large number of internal circuits are in operation, and a relatively fast response speed is required in order to cope with the AC voltage variations caused by these internal circuits operating at the same time.

Accordingly, the voltage-reduction circuits in the semiconductor integrated circuits are required to come under different controls, depending on the type of operation mode, i.e., either the standby mode or the active mode.

FIG. 1 is a circuit diagram of internal voltage-reduction circuits used in the related-art semiconductor-integrated-circuit devices. The voltage-reduction circuit of FIG. 1 includes an internal voltage-reduction circuit 200 used in both the standby mode and the active mode and an internal voltage-reduction circuit 210 used only in the active mode. The internal voltage-reduction circuit 200 includes PMOS transistors 201, 202, and 206 and NMOS transistors 203 through 205. The internal voltage-reduction circuit 210 includes PMOS transistors 211 and 212, NMOS transistors 213 through 215, PMOS transistors 216 through 218, and an inverter 219.

In the internal voltage-reduction circuit 200, the PMOS transistors 201 and 202 and the NMOS transistors 203 through 205 together form a differential amplifier. Namely, an internal voltage Vi supplied to internal circuits is compared with a reference voltage Vb, and the NMOS transistor 203 is turned on to lower a voltage at a node N1 when the reference voltage Vb is higher than the internal voltage Vi. The PMOS transistor 206 is thus turned on to raise the internal voltage Vi. On the other hand, when the reference voltage Vb is lower than the internal voltage Vi, the NMOS transistor 203 is turned off to step up the voltage at the node N1, thereby turning off the PMOS transistor 206 to lower the internal voltage Vi. In this manner, a drain voltage of the PMOS transistor 206 is fed back to the differential amplifier to produce the internal voltage Vi equal to the reference voltage Vb.

In the internal voltage-reduction circuit 210, the PMOS transistors 211 and 212 and the NMOS transistors 213 through 215 together form a differential amplifier. Namely, the internal voltage Vi supplied to internal circuits is compared with the reference voltage Vb, and the NMOS transistor 213 is turned on to lower a voltage at a node N2 when the reference voltage Vb is higher than the internal voltage Vi. The PMOS transistor 216 is thus turned on to raise the internal voltage Vi. On the other hand, when the reference voltage Vb is lower than the internal voltage Vi, the NMOS transistor 213 is turned off to step up the voltage at the node N2, thereby turning off the PMOS transistor 216 to lower the internal voltage Vi. In this manner, a drain voltage of the PMOS transistor 216 is fed back to the differential amplifier to produce the internal voltage Vi equal to the reference voltage Vb.

The internal voltage-reduction circuit 210 is also provided with a function to turn on or off the internal voltage-reduction circuit 210 according to a signal indicating an active mode of the semiconductor integrated circuit. Namely, a /RAS (row address strobe) signal used for a DRAM is provided as a gate input to the NMOS transistor 215 via the inverter 210, for example, so that the differential amplifier operates only when the /RAS signal is low. (RASX is low through the buffer taking the /RAS signal as an input.) The PMOS transistors 217 and 218 are provided to clamp the NMOS transistors 213 and 214 to the power voltage Vcc so as to prevent the voltage at the node N2 and the like from becoming an intermediate voltage during the non-operation of the differential amplifier.

Only the internal voltage-reduction circuit 200 supplies a current during the standby mode, so that a relatively small current amount and a relatively slow response speed to the voltage AC variations would suffice for the internal voltage-reduction circuit 200. In practice, a current amount in the range of $\mu$A and a response speed on the order of $\mu$sec are sufficient. Because of this, a gate width of the PMOS transistor 206 for providing a current to the internal circuits from the internal voltage-reduction circuit 200 can be relatively narrow. Further, a current consumption in the differential amplifier may be in the range of $\mu$A.

Since the internal voltage-reduction circuit 210 supplies a current to the internal circuits during the active mode, a large current should be supplied, and a response speed in responding to the voltage AC variations should be relatively fast. In practice, a current in the range of mA and a response speed on the order of nsec are required. To this end, the PMOS transistor 216 for supplying a current to the internal circuits from the internal voltage-reduction circuit 210 should have a relatively wide gate width. Further, a current consumed in the differential amplifier should be in the range of mA.

It is possible to use only the internal voltage-reduction circuit 210 in both the standby mode and the active mode. The use of the internal voltage-reduction circuit 210 during the standby mode which requires only a small amount of current, however, can be a cause of excessive power consumption since the internal voltage-reduction circuit 210 consumes more power than the internal voltage-reduction circuit 200. If five of the internal voltage-reduction circuits 210 each with 3-mA power consumption are provided in a semiconductor-integrated-circuit chip, for example, current consumption in these internal voltage-reduction circuits 210 becomes as much as 15 mA in total.

Accordingly, as shown in FIG. 1, the internal voltage-reduction circuit 200 with a smaller power consumption and the internal voltage-reduction circuit 210 with a larger power consumption should be provided, and be controlled depending on the standby mode or the active mode.

Some semiconductors have the standby mode further divided into two modes. An SDRAM (synchronous DRAM), for example, has an active mode for accessing memory cells for data-read/write operations, an idling mode for waiting for command input while keeping input circuits in operation, and a power-down mode in which even the input circuits are brought to a halt.

Differences between the idling mode and the power-down mode will be described below.

SDRAMs achieve high-speed operations and high-speed data transfer by operating in synchronism with a clock signal and transferring data via a bus in a small signal amplitude. The data transfer via the external bus is conducted in a small signal amplitude in this manner. Inside the SDRAMs, however, full amplitude signals are used. Because of this, the input circuits of the SDRAM serving as an interface for receiving input signals need to amplify the received input signals, and differential amplifiers are generally used as the input circuits.

FIG. 2 is a circuit diagram of an example of the differential amplifier. The differential amplifier of FIG. 2 includes PMOS transistors 221 and 222 and NMOS transistors 223 through 225. When a voltage of an input signal is lower than a reference voltage Vref, the differential amplifier supplies a high-level signal to internal circuits. When the input signal has a voltage higher than the reference voltage Vref, a low-level signal is supplied to the internal circuits. In such a differential amplifier, an enable signal Enable is turned to a high level at the time of the signal amplification to turn on the NMOS transistor 225.

During the idling mode of waiting for signal input, the differential amplifier should be in condition for amplification, i.e., the NMOS transistor 225 needs to be in a turned-on state. Because of this, the differential amplifier consumes a current during the idling mode. In the power-down mode, on the other hand, the NMOS transistor 225 is turned off since the input circuits are in an inactive state. The differential amplifier during the power-down mode thus does not consume electric current.

Assuming that 57 input nodes are provided in a chip, with 0.3-mA current consumption in each differential amplifier, the input circuits as a whole consume a current of 17 mA in the idling mode.

The internal voltage-reduction circuit 200 for use in the standby mode in the related art can only provide a current in the range of uA, and, thus, does not have a sufficient capacity to supply a necessary current in the idling mode. On the other hand, the internal voltage-reduction circuit 210 for use in the active mode in the related art has a capacity to provide a current in the range of mA, and, thus, can provide a sufficient current required in the idling mode. It is apparent, however, that the internal voltage-reduction circuit 210 possesses an excessive current supply capacity to be used in the idling mode since it is designed to provide a sufficient current in the active mode which consumes a larger amount of current than the idling mode. In other words, use of the internal voltage-reduction circuit 210 of the related art in the idling mode results in an excessive power consumption in the internal voltage-reduction circuit 210.

Accordingly, there is a need to provide an appropriate amount of current from internal voltage-reduction circuits commensurate with a required amount of current in each mode when semiconductor devices are provided with a plurality of operation modes.

SUMMARY OF THE INVENTION

Accordingly, it is a general object of the present invention to provide a device and a method which can satisfy the need described above.

It is another and more specific object of the present invention to provide a device and a method which can provide an appropriate amount of current from internal voltage-reduction circuits commensurate with a required current amount in each mode when semiconductor devices are provided with a plurality of operation modes.

In order to achieve the above objects according to the present invention, a semiconductor device which operates in a selected mode selected from a plurality of operation modes, a number of the operation modes being more than two, includes a plurality of voltage supply circuits for supplying an internal voltage to internal circuits of the semiconductor device, and a control circuit for driving a predetermined number of the voltage supply circuits based on a signal indicating the selected mode, the control circuit changing the predetermined number for each of the operation modes.

The same objects can be achieved by a method of supplying a current to internal circuits in a semiconductor device which operates in a selected mode among a plurality of operation modes, a number of the operation modes being more than two, the method including the steps of a) determining, based on a signal indicating the selected mode, a number of voltage supply circuits in operation for supplying the current to the internal circuits, and b) driving the number of the voltage supply circuits to supply a current required by the internal circuits in the selected mode, the number varying for each of the operation modes.

With this configuration, it is possible to drive appropriate numbers of the voltage supply circuits at appropriate positions within the semiconductor device, depending on the amount of current required by the internal circuits in each mode indicated by mode signals. Therefore, it is possible to keep power consumption by the internal circuits at a required minimum level.

Further, the above objects can be achieved by a semiconductor device operating in a mode selected from a first mode in which internal circuits are inactive, a second mode in which only input circuits among the internal circuits are active, and a third mode in which data access is made, the semiconductor device including a voltage supply circuit for supplying an internal voltage to at least one of the internal circuits, and a control circuit activating the voltage supply circuit in the second mode and the third mode but inactivating the voltage supply circuit in the first mode.

The semiconductor device described above is provided with the voltage supply circuit which is operated in the active mode (the third mode) and in the idling mode (the second mode) in which only the input circuits are active, but is not operated in the power-down mode (the first mode) in which all the internal circuits are inactive. This configuration allows only an appropriate amount of a current to be supplied with respect to each mode, thereby suppressing power consumption in the voltage supply circuit at a required minimum level.

Other objects and further features of the present invention will be apparent from the following detailed description when read in conjunction with the accompanying drawings.

DESCRIPTION OF THE PREFERRED EMBODIMENTS

In the following, a principle and embodiments of the present invention will be described with reference to the accompanying drawings.

Figure 3:
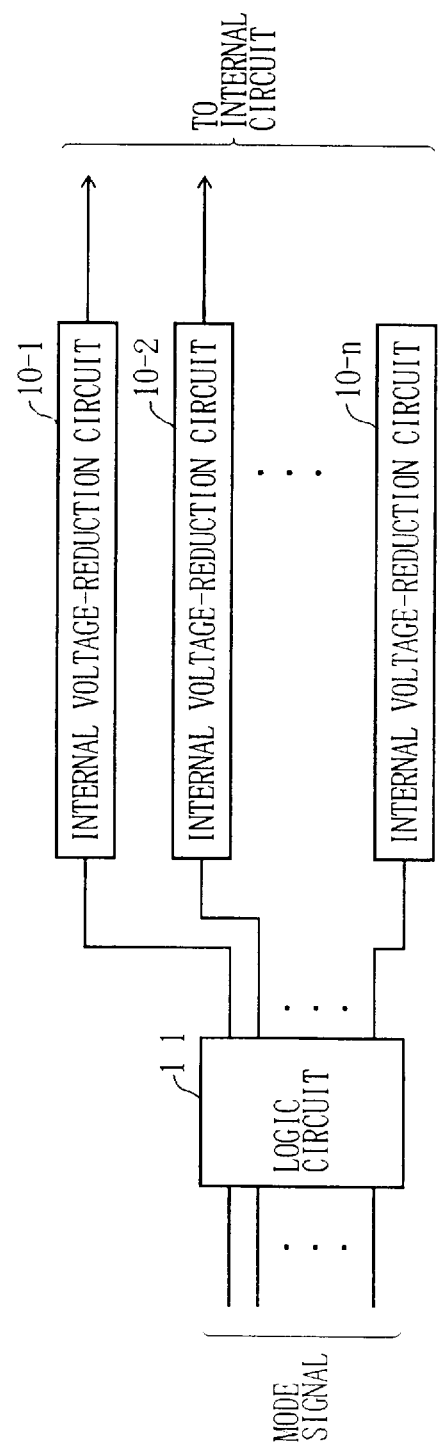
FIG. 3 is a block diagram showing a principle of the present invention.

FIG. 3 is a block diagram showing a principle of the present invention. As shown in FIG. 3, according to the principle of the present invention, internal voltage-reduction circuits 10-1 through 10-n provided in a total of n circuits are driven by a signal supplied from a logic circuit 11. The logic circuit 11 receives mode signals indicating an operation mode of a semiconductor integrated circuit, and drives some of the internal voltage-reduction circuits 10-1 through 10-n according a result of a logic operation of the mode signals. That is, which circuits of the internal voltage-reduction circuits 10-1 through 10-n are driven is determined based on the logic operation by the logic circuit 11. Reduced voltage levels are supplied to internal circuits of the semiconductor integrated circuit from the internal voltage-reduction circuits 10-1 through 10-n.

With this configuration, it is possible to drive appropriate numbers of internal voltage-reduction circuits at appropriate positions within the semiconductor integrated circuit, depending on the amount of current required by the internal circuits in each mode indicated by the mode signals. Therefore, it is possible to keep power consumption by the internal circuits at a required minimum level.

Figure 4:
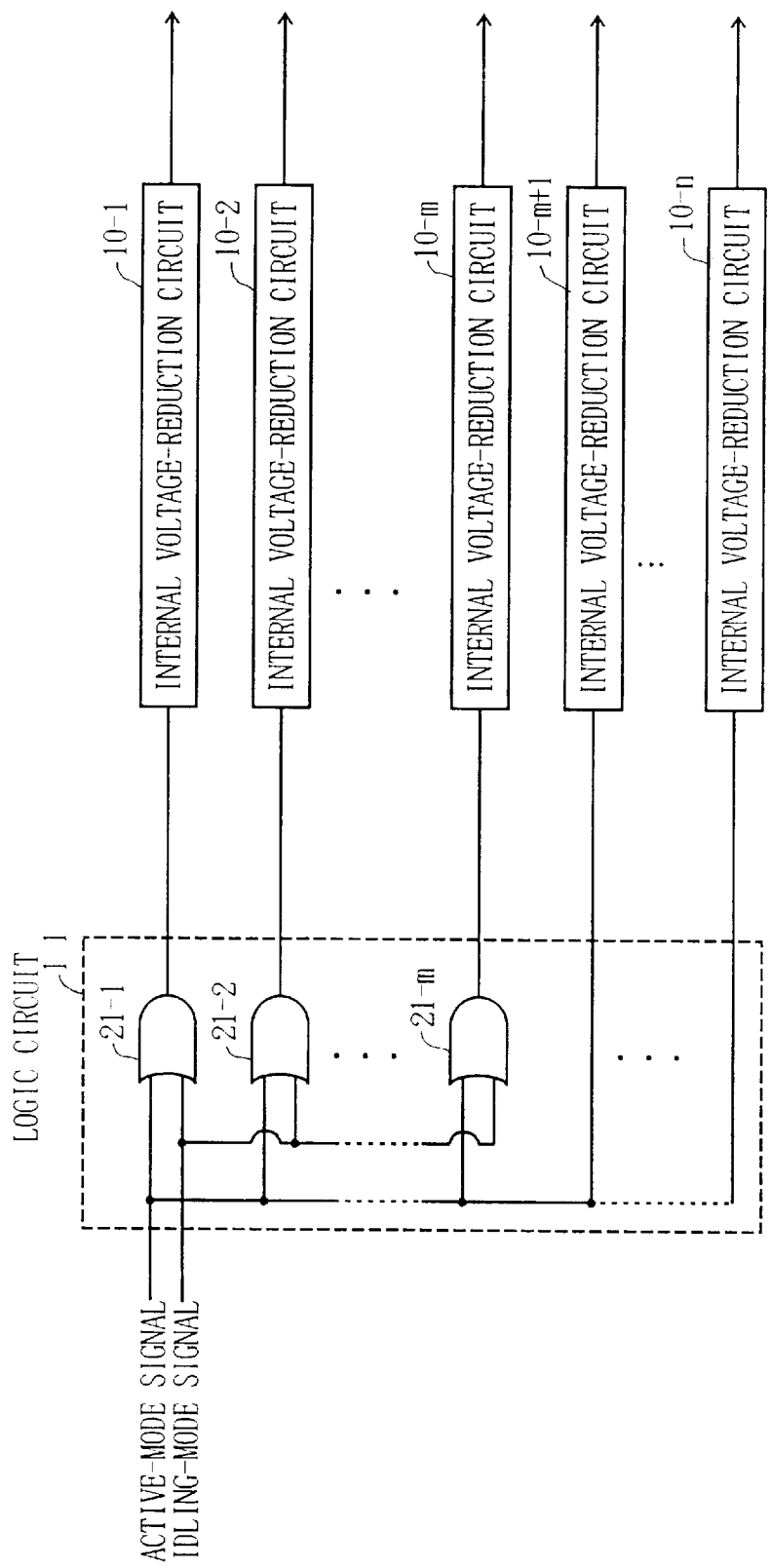
FIG. 4 is a block diagram of a configuration in which the principle of the present invention is applied to an SDRAM.

FIG. 4 is a block diagram of a configuration in which the principle of the present invention is applied to an SDRAM. In FIG. 4, the mode signals include an active-mode signal for indicating the active mode and an idling-mode signal for indicating the idling mode. The logic circuit 11 includes OR circuits 21-1 through 21-m each of which receives the active-mode signal at one input and the idling-mode signal at the other input.

The OR circuits 21-1 through 21-m take a logical sum between the active-mode signal and the idling-mode signal and supplies a result of the logical sum to the internal voltage-reduction circuits 10-1 through 10-m (m<n). Namely, the internal voltage-reduction circuits 10-1 through 10-m operate in both the active mode and the idling mode, and supply the reduced voltage level to the internal circuits inside the SDRAM. The internal voltage-reduction circuits 10-1 through 10-m have their main purpose in providing the reduced voltage level to input circuits operating in the idling mode.

The logic circuit 11 supplies the active-mode signal to the internal voltage-reduction circuits 10-m+1 through 10-n. Namely, the internal voltage-reduction circuits 10-m+1 through 10-n operate only in the active mode to provide the reduced voltage level to the internal circuits inside the SDRAM. The internal voltage-reduction circuits 10-m+1 through 10-n have their main purpose in supplying the reduced voltage level to the internal circuits which operate in the active mode but do not operate in the idling mode.

With this configuration, it is possible to supply the amount of current required by the active input circuits from the internal voltage-reduction circuits 10-1 through 10-m in the idling mode of the SDRAM and to supply the amount of current required by the active internal circuits including the input circuits from the internal voltage-reduction circuits 10-m+1 through 10-n in the active mode. Therefore, it is possible to drive appropriate numbers of internal voltage-reduction circuits at appropriate positions within the SDRAM, thereby keeping the power consumption of the internal circuits at a required minimum level.

Figure 5:
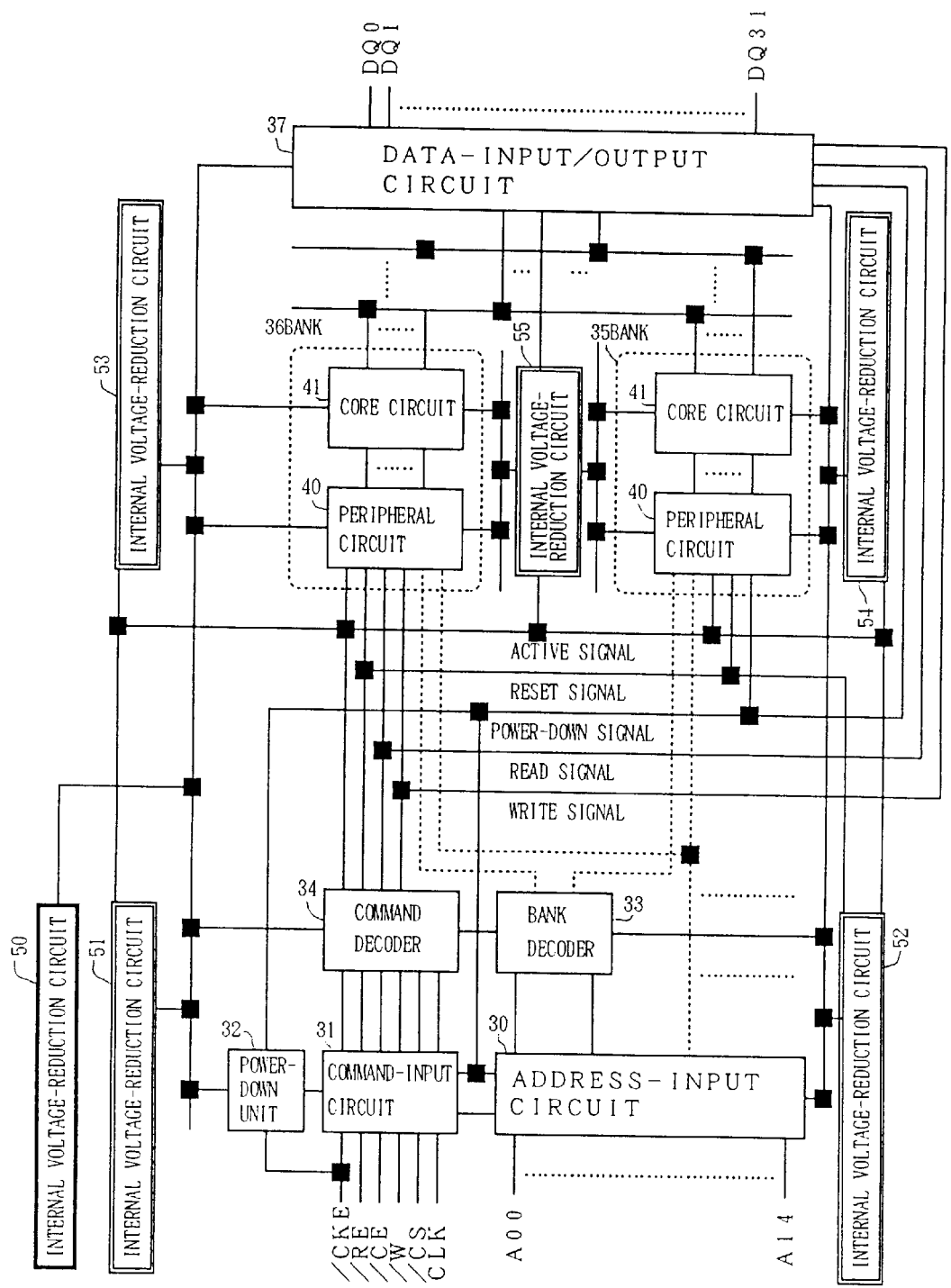
FIG. 5 is a block diagram of an SDRAM to which the present invention is applied.

FIG. 5 is a block diagram of an SDRAM to which the present invention is applied. The SDRAM of FIG. 5 includes an address-input circuit 30, a command-input circuit 31, a power-down unit 32, a bank decoder 33, a command decoder 34, a bank 35, a bank 36, a data-input/output circuit 37, and internal voltage-reduction circuits 50 through 55. Each of the banks 35 and 36 includes a peripheral circuit 40 and a core circuit 41.

Command signals such as /RE (ras enable), /CE (cas enable), /W (write), /CS (chip select), CKE (clock enable), etc., which are provided from external sources are buffered by the command-input circuit 31, and are supplied to the command decoder 34. The command decoder 34 decodes and interprets the supplied command signals to produce a write signal, a read signal, an idling (reset or precharge) signal, an active signal, and the like. The write signal, read signal, idling signal, and active signal as well as a power-down signal generated by the power-down unit 32 are used for controlling the internal circuits of the SDRAM. The write signal indicates that the SDRAM is in a write-operation state (write mode), and the read signal indicates that the SDRAM is in a read-operation state (read mode). The power-down signal, the idling signal, and the active signal represent the power-down mode, the idling mode, and the active mode of the SDRAM, respectively.

The idling (reset or precharge) signal resets the active mode, the read mode, and the write mode of the SDRAM, and sets the SDRAM to the idling mode in the absence of the power-down signal.

Address signals A00 through A14 provided from an external source are buffered by the address-input circuit 30, and some of the signals (e.g., the address signals A13 and A14) are supplied to the bank decoder 33. The bank decoder 33 decodes the supplied address signals A13 and A14 to select one of the banks. In FIG. 5, only two banks 35 and 36 are shown for clarity of the figure. The remaining address signals A00 through A12 are supplied to each of the banks 35 and 36. In a selected one of the banks 35 and 36, the peripheral circuit 40 decodes the supplied address signals A00 through A12 to access an indicated address in the core circuit 41.

In the case of the data-read operation, data is read from the indicated address of the core circuit 41 in a selected one of the banks 35 and 36, and is output via the data-input/output circuit 37 as data DQ0 through DQ31. In the case of the data-write operation, the data DQ0 through DQ31 supplied to the data-input/output circuit 37 from an external source is written into the indicated address of the core circuit 41 in the selected one of the banks 35 and 36.

Figure 2:
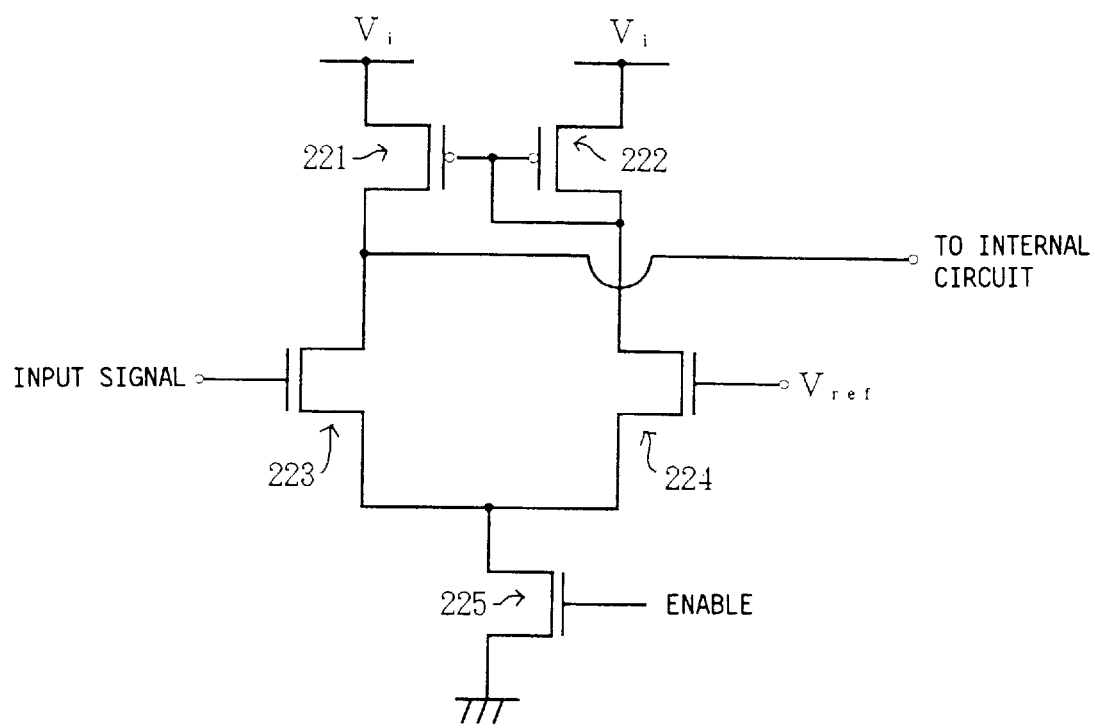
FIG. 2 is a circuit diagram of an example of a differential amplifier.

The power-down unit 32 monitors the /CKE signal, and enables the power-down signal when the power-down mode is indicated. The power-down signal is supplied to the address-input circuit 30, the command-input circuit 31, and the data-input/output circuit 37 to bring these circuits to a halt at the time of the power-down mode. In practice, the NMOS transistor 225 of the differential amplifier shown in FIG. 2, for example, is used in these circuits, and is provided with an inverse of the power-down signal at the gate input. The power-down unit 32 monitors the /CKE signal and disables the power-down signal when the power-down mode comes to an end, thereby putting the address-input circuit 30, the command-input circuit 31, and the data-input/output circuit 37 into operation.

The internal voltage-reduction circuit 50 operates at all times regardless of the operation mode of the SDRAM, and supplies a reduced voltage level to the internal circuits in the SDRAM. The internal voltage-reduction circuit 50 is provided to drive the power-down unit 32 during the power-down mode.

Figure 6:
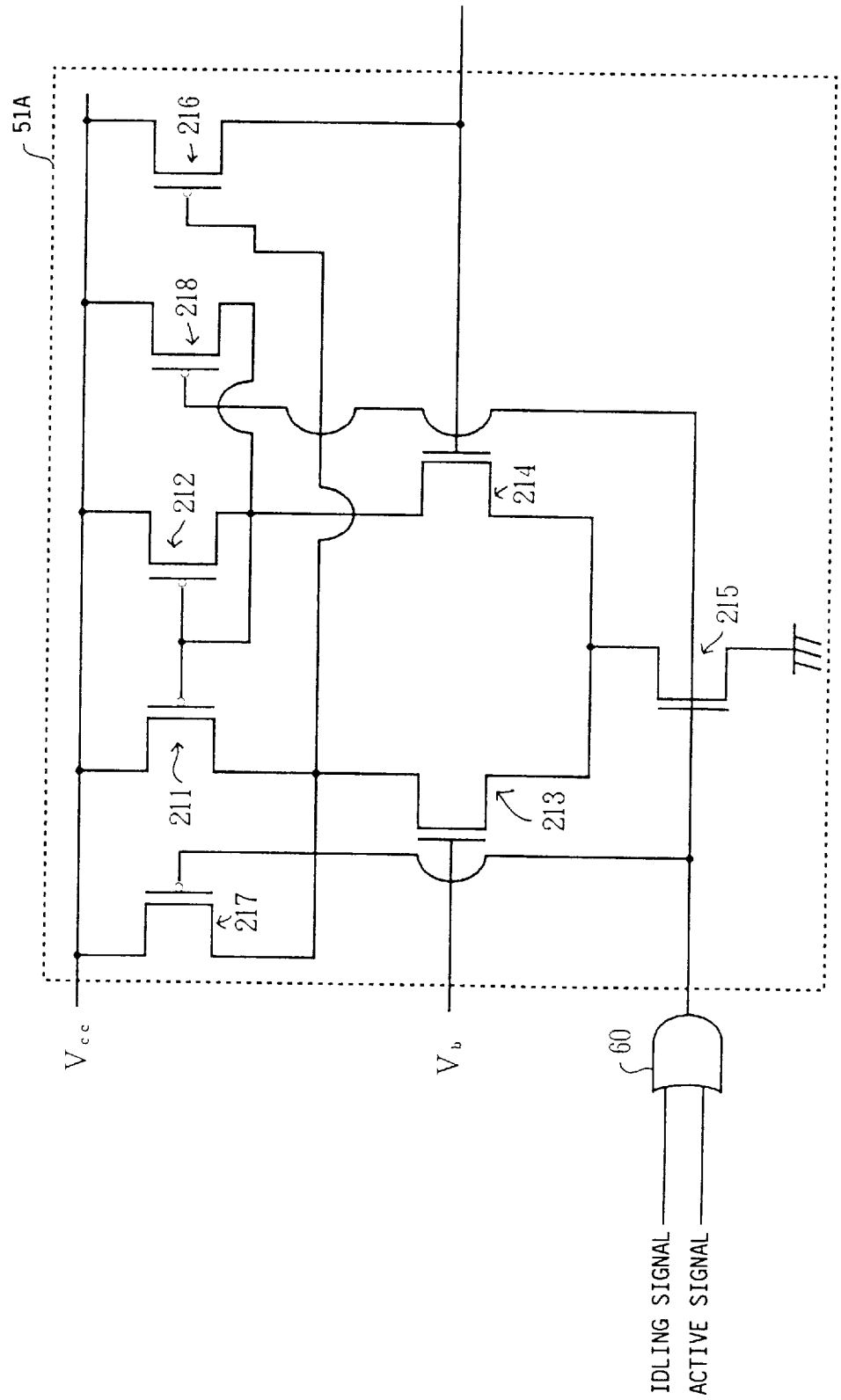
FIG. 6 is a circuit diagram showing an example of a circuit structure of an internal voltage-reduction circuit with a built-in logic circuit.

The internal voltage-reduction circuits 51 through 55 are circuits to which the present invention is applied. Different from the configuration of FIG. 4, the internal voltage-reduction circuits 51 through 55 are each provided with the logic circuit 11 in a built-in structure. FIG. 6 is a circuit diagram showing an example of a circuit structure of the internal voltage-reduction circuit 51 with the logic circuit 11 built in.

Figure 1:
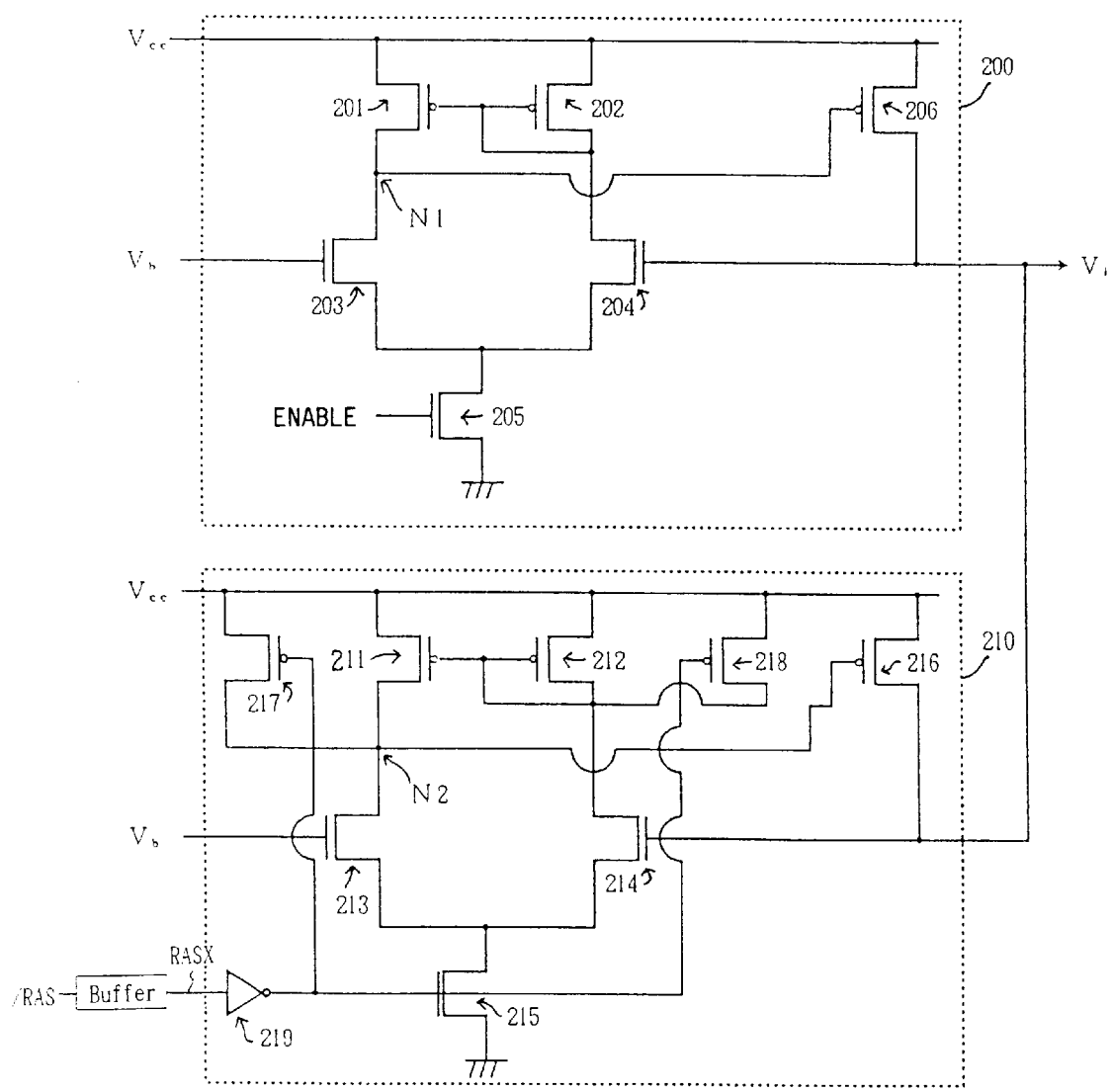
FIG. 1 is a circuit diagram of an internal voltage-reduction circuits used in the related-art semiconductor-integrated-circuit devices.

As shown in FIG. 6, the internal voltage-reduction circuit 51, for example, includes an internal voltage-reduction circuit 51A having a configuration almost identical to that of the internal voltage-reduction circuit 210 (FIG. 1), and further includes an OR circuit 60 as the built-in logic circuit 11. The internal voltage-reduction circuit 51 receives the idling signal and the active signal, and takes a logical sum of these signals by using the OR circuit 60. According to a result of the logical sum, the internal voltage-reduction circuit 51A is controlled to operate or not to operate.

By incorporating the logic circuit 11 into the internal voltage-reduction circuits, mode-signal lines can be directly supplied to the internal voltage-reduction circuits to transfer the power-down signal, the idling signal, and the active signal. This simplifies the layout of lines in the SDRAM.

In reality, as shown in FIG. 5, the internal voltage-reduction circuit 50 is not provided with a signal line since this circuit is in operation at all times. The internal voltage-reduction circuits 51 and 52 receive the idling signal and the active signal, and supplies the reduced voltage level to the internal circuits in the SDRAM during the idling mode and the active mode. The internal voltage-reduction circuits 53 through 55 receive only the active signal, and supplies the reduced voltage level to the internal circuits in the SDRAM only in the active mode. That is, the internal voltage-reduction circuits 53 through 55 are not provided with the OR circuit 60 as is the internal voltage-reduction circuit 51, and an operation state of the internal voltage-reduction circuits 53 through 55 as to whether or not to operate is directly controlled by the active signal.

As shown in FIG. 5, the internal voltage-reduction circuits 50 through 55 are positioned at various locations in order to reduce a spatial variation in the reduced voltage level within the SDRAM chip. The internal voltage-reduction circuits 51 and 52 are mainly used for supplying the reduced voltage level to the address-input circuit 30, the command-input circuit 31, the power-down unit 32, the bank decoder 33, and the command decoder 34. The internal voltage-reduction circuits 53 and 54 are provided in order to supply the reduced voltage level mainly to the banks 35 and 36 and the data-input/output circuit 37. The internal voltage-reduction circuit 55 is dedicated to be used for supplying the reduced voltage level to the banks 35 and 36 and the data-input/output circuit 37.

In the power-down mode, only the internal voltage-reduction circuit 50 operates to supply a power current to the power-down unit 32, as previously described.

In the idling mode, the internal voltage-reduction circuits 51 and 52 in addition to the internal voltage-reduction circuit 50 operate to supply a necessary current for driving the input circuits such as the address-input circuit 30 and the command-input circuit 31.

In the active mode, the internal voltage-reduction circuits 53 through 55 operate in addition to the internal voltage-reduction circuits 50 through 52, so that a necessary current is supplied for driving the peripheral circuit 40 and the core circuit 41 of the banks 35 and 36 as well as the data-input/output circuit 37.

In this manner, the internal circuits operating in the active mode exist all across the chip area of the SDRAM, but only the input circuits should be activated in the idling mode. Further, only the power-down unit should be operated in the power-down mode. In consideration of this, only an appropriate number of internal voltage-reduction circuits are operated at appropriate positions in the chip, according to the mode signals (e.g., the idling signal and the active signal) indicating the operation mode. This makes it possible to keep the power consumption in the internal voltage-reduction circuits at a required minimum level with respect to each mode.

The present invention has been described with reference to particular embodiments, but is not limited to these embodiments and various modifications can be made.

For example, FIGS. 4 and 5 use only the active-mode signal (active signal) and the idling-mode signal (idling signal) for determining the number of internal voltage-reduction circuits in operation. However, all of the active-mode signal, the idling-mode signal, and the power-down signal may be used for determining the number of internal voltage-reduction circuits in operation. Further, the example of FIG. 6 shows the logic circuit 11 of FIG. 4 incorporated in the internal voltage-reduction circuit. However, logic operation functions of the internal voltage-reduction circuits may be gathered at one location to be put together as a single logic circuit.

Further, the present invention is not limited to these embodiments, but variations and modifications may be made without departing from the scope of the present invention.

What is claimed is:

1. A semiconductor device with internal circuits which operates in a selected mode selected from a plurality of operation modes, a number of said operation modes being more than two, said semiconductor device comprising:

a plurality of internal voltage-reduction circuits for supplying an internal voltage to the internal circuits of said semiconductor device via at least one shared voltage-supply line shared by at least some of said plurality of internal voltage-reduction circuits; and a control circuit for driving a predetermined number of said internal voltage-reduction circuits based on a signal indicating said selected mode, said control circuit changing said predetermined number for each of said operation modes.

2. The semiconductor device as claimed in claim 1, wherein said device is a synchronous DRAM.

3. The semiconductor device as claimed in claim 2, wherein said operation modes include a first mode in which said internal circuits are inactive, a second mode in which only input circuits among said internal circuits are active, and a third mode in which data access is made, and said control circuit controls said predetermined number so as to be largest in said third mode, second largest in said second mode, and smallest in said first mode.

4. The semiconductor device as claimed in claim 1, wherein said control circuit determines said predetermined number based on a result of a logic operation of signals indicating said operation modes.

5. The semiconductor device as claimed in claim 1, wherein said control circuit is provided for an individual internal voltage-reduction circuit.

6. A method of supplying a current to internal circuits in a semiconductor device which operates in a selected mode selected from a plurality of operation modes, a number of said operation modes being more than two, said method comprising the steps of:

a) determining, based on a signal indicating said selected mode, a number of internal voltage-reduction circuits in operation for supplying said current to said internal circuits via at least one shared voltage-supply line shared by at least some of said internal voltage-reduction circuits; and b) driving said number of said internal voltage-reduction circuits to supply a current required by said internal circuits in said selected mode, said number varying for each of said operation modes.

7. The method as claimed in claim 6, wherein said semiconductor device comprises a synchronous DRAM.

8. The method as claimed in claim 7, wherein said operation modes include a first mode in which said internal circuits are inactive, a second mode in which only input circuits among said internal circuits are active, and a third mode in which data access is made, and said step a) determines said predetermined number to be largest in said third mode, second largest in said second mode, and smallest in said first mode.

9. The method as claimed in claim 6, wherein said step a) determines said predetermined number based on a result of a logic operation of signals indicating said operation modes.

10. A semiconductor device operating in one of a plurality of modes selected from a first mode in which internal circuits are inactive, a second mode in which only input circuits among said internal circuits are active, and a third mode in which data access is made, said semiconductor device comprising:

an internal voltage-reduction circuit for supplying an internal voltage to at least one of said internal circuits via at least one shared voltage-supply line, said internal voltage-reduction circuit sharing said at least one shared voltage-supply line with at least one of other internal-voltage reduction circuits; and a control circuit activating said internal voltage-reduction circuit in said second mode and said third mode but inactivating said internal voltage-reduction circuit in said first mode.

* * * * *